United States Patent
Araki et al.

(10) Patent No.: US 10,621,893 B2
(45) Date of Patent: Apr. 14, 2020

(54) DISPLAY DEVICE, MANUFACTURING METHOD FOR DISPLAY DEVICE, MANUFACTURING APPARATUS OF DISPLAY DEVICE, MOUNTING DEVICE, AND CONTROLLER

(71) Applicant: Sharp Kabushiki Kaisha, Sakai, Osaka (JP)

(72) Inventors: Ryoh Araki, Sakai (JP); Taketoshi Nakano, Sakai (JP); Tsuyoshi Kawaguchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 112 days.

(21) Appl. No.: 16/068,374

(22) PCT Filed: Mar. 30, 2017

(86) PCT No.: PCT/JP2017/013240
§ 371 (c)(1),
(2) Date: Jul. 6, 2018

(87) PCT Pub. No.: WO2018/179215
PCT Pub. Date: Oct. 4, 2018

(65) Prior Publication Data
US 2019/0362655 A1    Nov. 28, 2019

(51) Int. Cl.
*H01L 51/00* (2006.01)
*G09F 9/30* (2006.01)
(Continued)

(52) U.S. Cl.
CPC .......... *G09F 9/301* (2013.01); *H01L 51/0097* (2013.01); *H01L 51/5012* (2013.01);
(Continued)

(58) Field of Classification Search
CPC .. G02F 1/133305; G06F 1/1652; G09F 9/301; H01L 51/0097; H01L 2251/5338
See application file for complete search history.

(56) References Cited

U.S. PATENT DOCUMENTS

2006/0097957 A1    5/2006 Ben-Shalom
2007/0247422 A1    10/2007 Vertegaal et al.
(Continued)

FOREIGN PATENT DOCUMENTS

CN    104576965 A  *  2/2017  ......... H01L 51/0097
JP    4-110992 A    4/1992
(Continued)

OTHER PUBLICATIONS

Official Communication issued in International Patent Application No. PCT/JP2017/013240, dated Jun. 27, 2017.

*Primary Examiner* — Adrian S Wilson
(74) *Attorney, Agent, or Firm* — Keating & Bennett, LLP

(57) ABSTRACT

A display device with a first edge and a second edge, the first edge and the second edge extending in a same direction, the display device including a light-emitting layer, and an electronic circuit board, wherein the display device emits light toward a front side with the display device is bent as a first terminal portion disposed on a surface of an end portion on the first edge and a second terminal portion disposed on a back face of an end portion on the second edge facing one another, and the electronic circuit board includes a first surface mounted to the first terminal portion and a second surface opposite the first surface and mounted to the second terminal portion.

18 Claims, 11 Drawing Sheets

(51) Int. Cl.
 *H01L 51/50* (2006.01)
 *H05B 33/06* (2006.01)
 *H05B 33/08* (2020.01)
 *H01L 51/52* (2006.01)
(52) U.S. Cl.
 CPC ............ *H05B 33/06* (2013.01); *H05B 33/08* (2013.01); *H01L 51/5221* (2013.01)

(56) References Cited

U.S. PATENT DOCUMENTS

| | | | | |
|---|---|---|---|---|
| 2013/0128199 A1* | 5/2013 | Yamazaki | ......... | G02F 1/133305 349/122 |
| 2014/0062892 A1* | 3/2014 | Dickinson | ............ | G06F 3/0412 345/173 |
| 2014/0307395 A1* | 10/2014 | An | ........................ | G06F 1/1652 361/749 |
| 2016/0210103 A1 | 7/2016 | Yoshizumi et al. | | |

FOREIGN PATENT DOCUMENTS

| | | | |
|---|---|---|---|
| JP | 2004-177891 | A | 6/2004 |
| JP | 2005-108516 | A | 4/2005 |
| JP | 2012-532804 | A | 12/2012 |
| JP | 2016-167049 | A | 9/2016 |
| WO | 2008/149768 | A1 | 12/2008 |

* cited by examiner

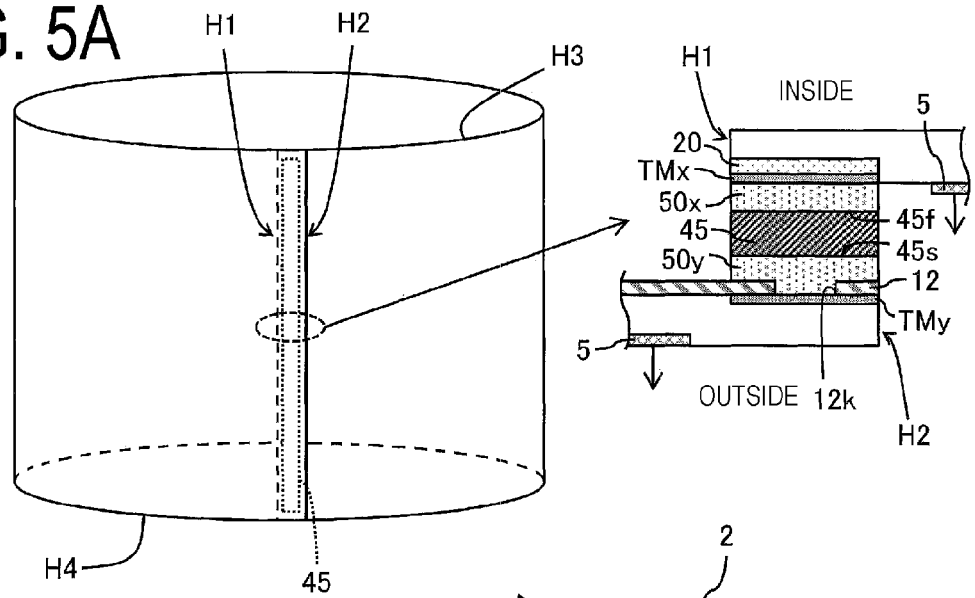
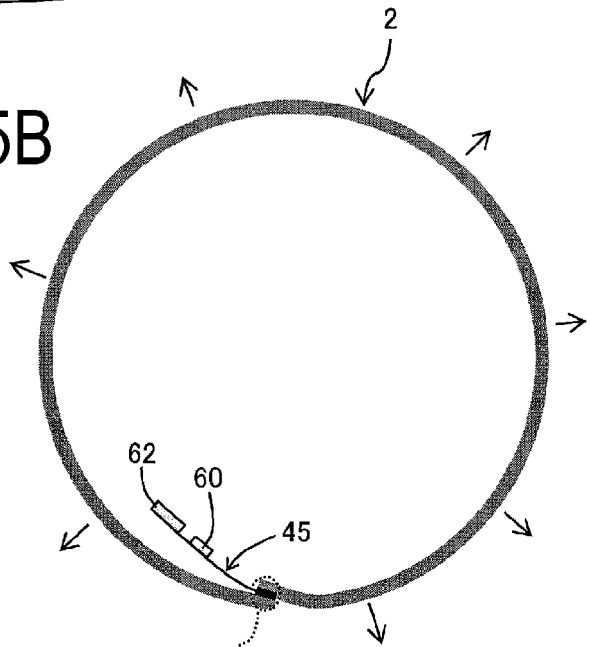
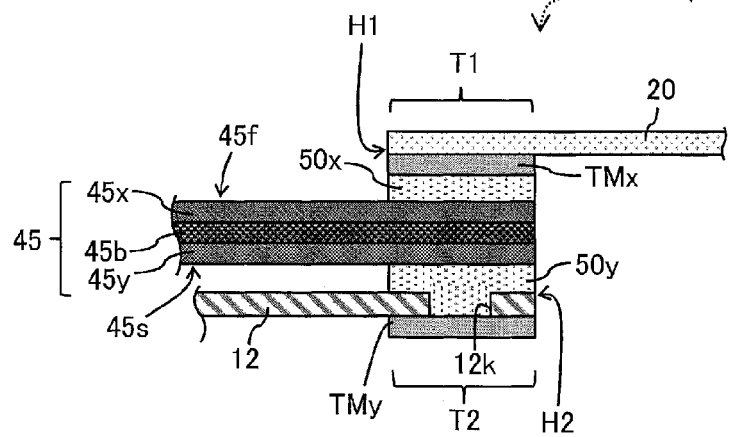

DISPLAY DEVICE, MANUFACTURING METHOD FOR DISPLAY DEVICE, MANUFACTURING APPARATUS OF DISPLAY DEVICE, MOUNTING DEVICE, AND CONTROLLER

TECHNICAL FIELD

The disclosure relates to a display device.

BACKGROUND ART

PTL 1 discloses a cylindrical display with a cylindrical shaped formed by bending a flexible display panel.

CITATION LIST

Patent Literature

PTL 1: JP 2016-167049 A (Publication Date: Sep. 15, 2016)

SUMMARY

Technical Problem

Such a display is viewed from a plurality of directions, and it is desired to decrease a non-display portion (a seam in an image).

Solution to Problem

A display device according to one embodiment of the disclosure is a flexible display device with a first edge and a second edge, the first edge and the second edge extending in a same direction, the flexible display device including a light-emitting element layer, and an electronic circuit board, wherein the flexible display device emits light toward a front side with the flexible display device being bent as a first terminal portion disposed on a surface of an end portion on the first edge and a second terminal portion disposed on a back face of an end portion on the second edge, the first terminal portion and the second terminal portion overlap one another, and the electronic circuit board includes a first surface and a second surface opposite the first surface, the first surface being mounted to the first terminal portion and the second surface opposite the first surface being mounted to the second terminal portion.

Advantageous Effects of Invention

According to one embodiment of the disclosure, it is possible to decrease a non-display portion (a seam in an image).

BRIEF DESCRIPTION OF DRAWINGS

FIG. 5A is a perspective view, FIG. 5B is a cross-sectional view, and FIG. 5C is another cross-sectional view, illustrating a configuration example of the display device according to the first embodiment.

DESCRIPTION OF EMBODIMENTS

Figure 1:
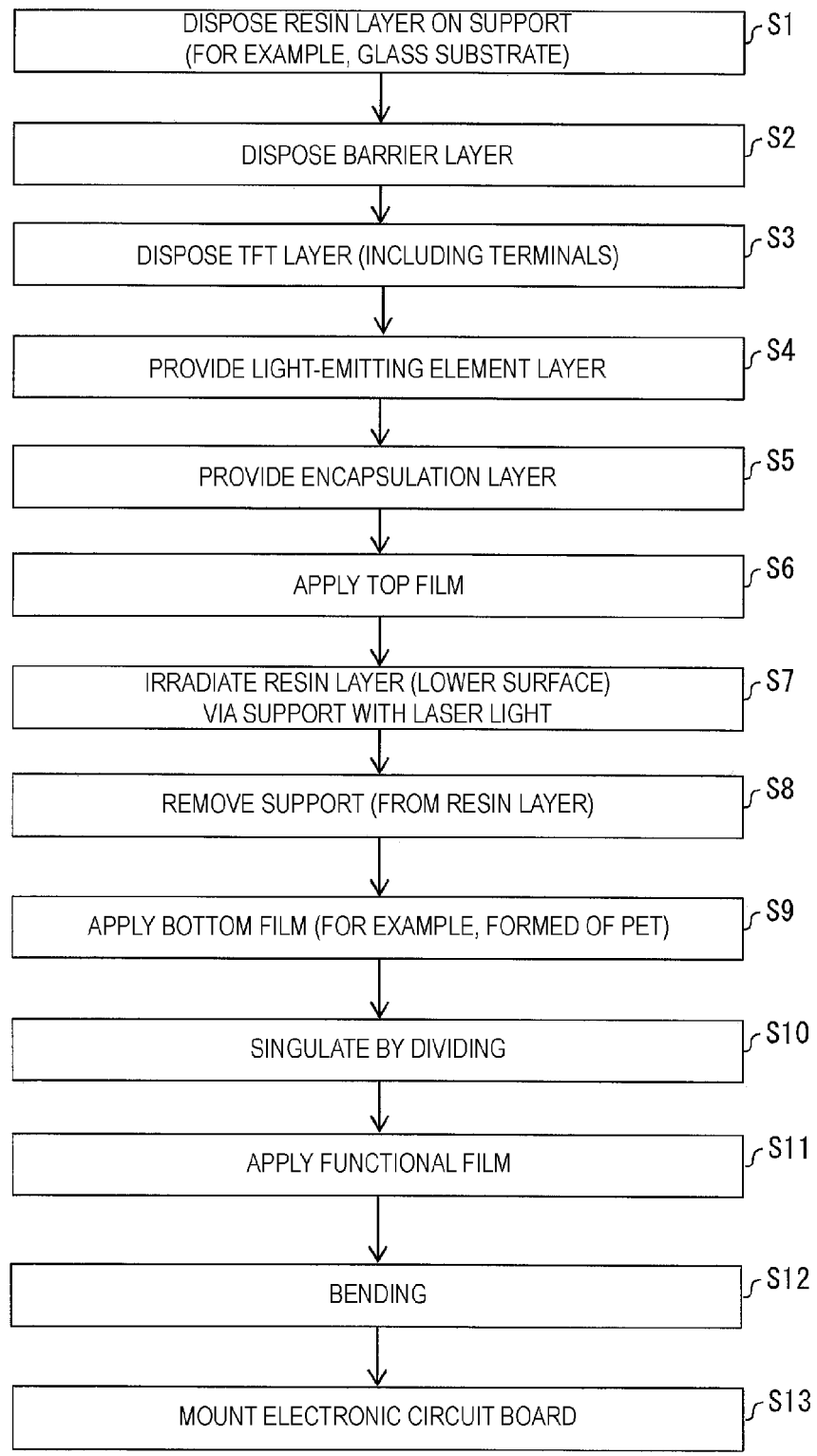
FIG. 1 is a flowchart illustrating one example of a manufacturing method of a display device.
Figure 2A:
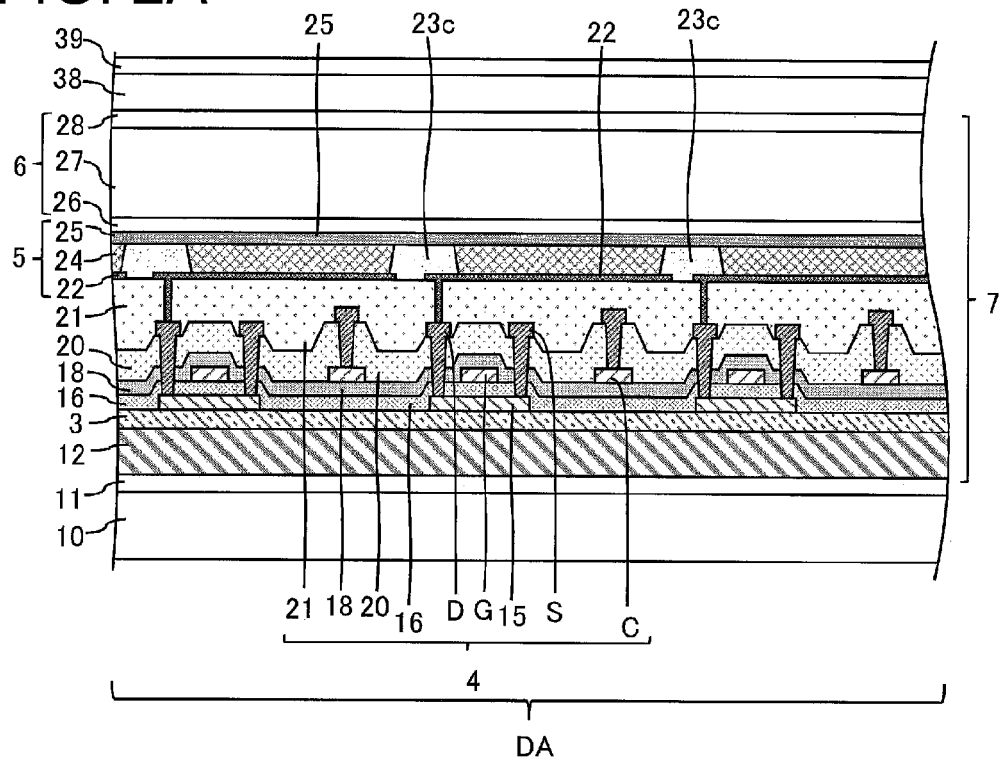
FIG. 2A is a cross-sectional view illustrating a configuration example of a display device (at an active region) according to a first embodiment.
Figure 2B:
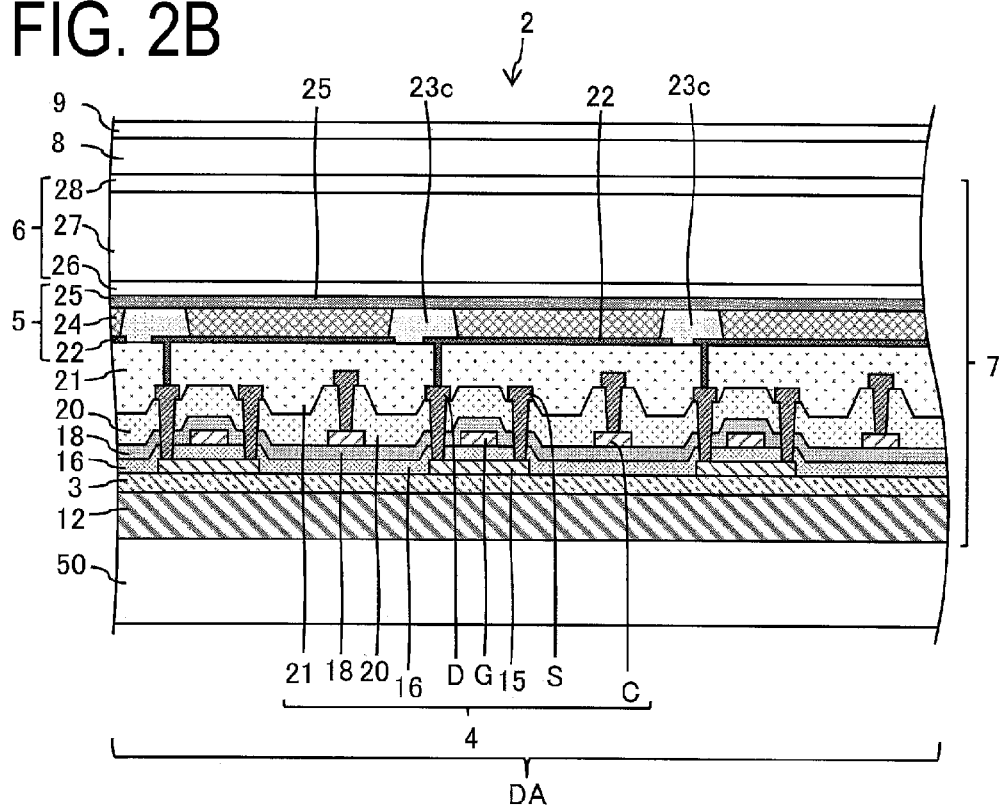
FIG. 2B is a cross-sectional view illustrating a configuration example of the display device (at the active region) according to the first embodiment in production.
Figure 3A:
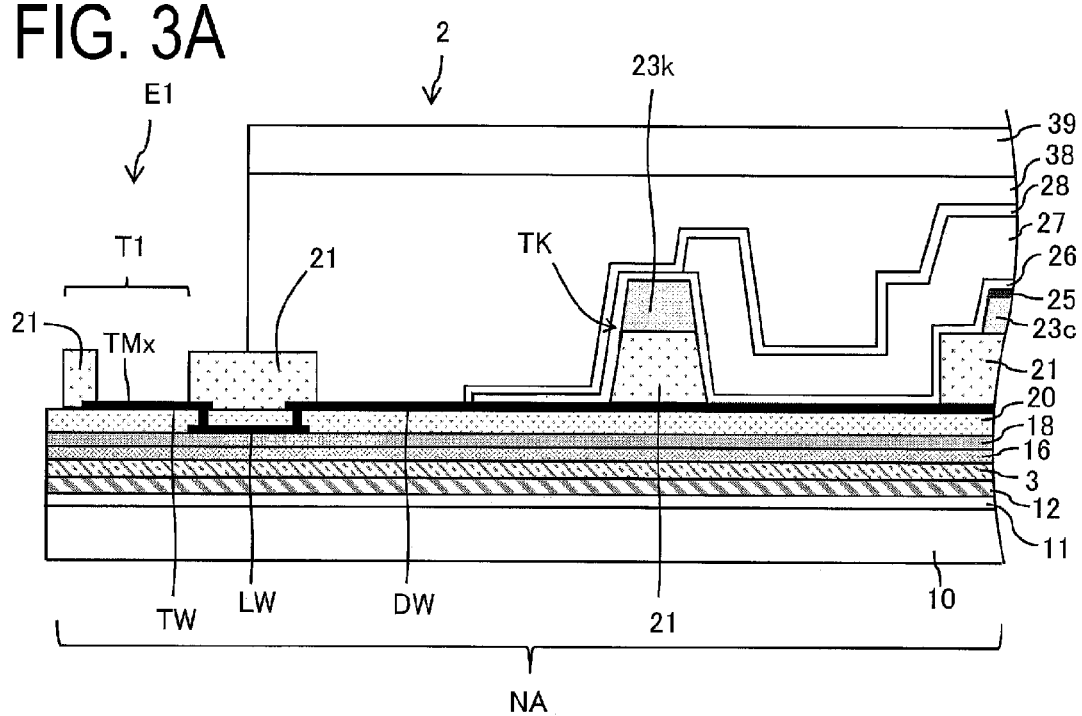
FIGS. 3A and 3B are cross-sectional views illustrating a configuration example of the display device (at an inactive region) according to the first embodiment.
Figure 3B:
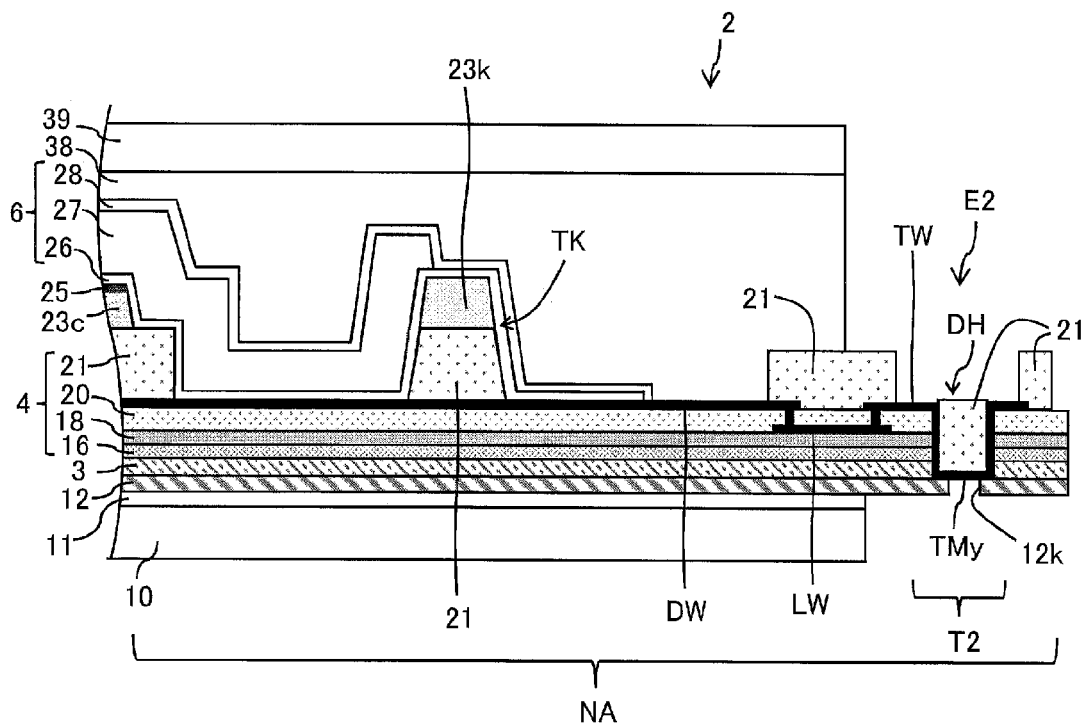

FIG. 1 is a flowchart illustrating one example of manufacturing method for a display device. FIG. 2A is a cross-sectional view illustrating a configuration example of a display device (at an active region) according to a first embodiment, and FIG. 2B is a cross-sectional view illustrating a configuration example of the display device (at the active region) according to the first embodiment in production. FIGS. 3A and 3B are cross-sectional views illustrating a configuration example of the display device (at an inactive region) according to the first embodiment.

As illustrated in FIGS. 1 and 2B, first, a resin layer 12 is formed on a light-transmitting support 50 (for example, a glass substrate) (Step S1). Next, a barrier layer 3 is formed (Step S2). Next, a TFT layer 4 is formed (Step S3). Next, a light-emitting element layer (for example, an Organic light-emitting Diode, (OLED) element layer) 5 is formed (Step S4). Next, an encapsulation layer 6 is formed (Step S5). Next, a top film 9 is applied to the encapsulation layer 6 via an adhesive layer 8 (Step S6).

Next, the lower surface of the resin layer 12 is irradiated with a laser light through the support 50 (Step S7). In this situation, the resin layer 12 absorbs the laser light irradiated to the lower surface of the support 50 transmitting through the support 50, such that the lower surface of the resin layer 12 (i.e. the interface between the lower surface and the support 50) is modified by ablation, and thus a bonding strength between the resin layer 12 and the support 50 is lowered. Next, the support 50 is removed from the resin layer 12 (Step S8). Next, a bottom film 10 (for example, formed of PolyEthylene Terephthalate (PET)) is applied to the lower surface of the resin layer 12 via an adhesive layer 11 (Step S9). Next, the resultant laminate including the bottom film is split and singulated (Step S10). Next, a functional film 39 is applied via the adhesive layer 38 (Step S11). In this way, a singulated flexible display device 2 as illustrated in FIGS. 2A, 3A and 3B is obtained. Next, the display device 2 is bent (Step S12). Then, an electronic circuit board 60 is mounted on a terminal portion of the back face of a terminal portion of the TFT layer 4 (Step S13). The aforementioned steps are carried out with a manufacturing apparatus of a display device.

Materials for the bottom film 10 include, for example, polyethylene terephthalate (PET). Materials for the resin layer 12 include, for example, polyimide, epoxy, and polyamide.

The barrier layer 3 is a layer configured to prevent water or impurities from reaching the TFT layer 4 or a light-emitting element layer 5. The barrier layer 3 is formed by Chemical Vapor Deposition (CVD), and may be formed of a silicon oxide film, a silicon nitride film, a silicon oxynitride film, or a layered film composed of these. The barrier layer 3 has a thickness of, for example, from 50 nm to 1500 nm.

The TFT layer 4 includes a semiconductor film 15, a gate insulating film 16 (inorganic insulating film) which is formed in a layer above the semiconductor film 15, a gate electrode G which is formed in a layer above the gate insulating film 16, passivation films (inorganic insulating films) 18 and 20 which are formed in layers above the gate electrode G, a capacitance electrode C and a terminal TMx which are respectively formed in layers above the passivation film 18, a source wiring S and a drain wiring D which are formed in a layer above the passivation film 20, and an organic interlayer film (flattening film) 21 which is formed in a layer above the source wiring S and the drain wiring D. A Thin-Film Transistor (TFT) is configured to include the semiconductor film 15, the gate insulating film 16, and the gate electrode G. At the opposite ends of the TFT layer 4, a plurality of terminals TMx and TMy are formed to connect with an electronic circuit board.

The semiconductor film 15 is formed of, for example, a Low Temperature PolySilicon (LTPS) or an oxide semiconductor. A semiconductor film 15 formed of a low temperature polysilicon and a semiconductor film 15 formed of oxide semiconductor may be disposed. The gate insulating film 16 may be formed of, for example, a silicon oxide (SiOx) film, a silicon nitride film (SiNx), or a layered film composed of them. These films are deposited by a Chemical Vapor Deposition (CVD) method. The gate electrode G, the source electrode S, the drain electrode D, and the terminals are formed of a metallic mono layer film or a metallic layered film, for example, containing at least one of aluminum (Al), tungsten (W), molybdenum (No), tantalum (Ta), chromium (Cr), titanium (Ti), and copper (Cu). Although FIGS. 2A and 2B illustrate the TFT having a top gate structure in which the semiconductor film 15 provides a channel, the TFT may have a bottom gate structure (for example, in case that the channel of the TFT is formed of oxide semiconductor).

The gate insulating film 16, the passivation films 18 and 20 may be formed of a silicon oxide (SiOx) film, a silicon nitride (SiNx) film, or a layered film composed of these. These films may be deposited by a CVD method.

The flattening film 21 may be formed of photosensitive organic material such as polyimide or acryl which may be coated. The flattening film 21 at an active region (a region overlapping the light-emitting element layer 5, i.e., a display region) is configured to function as a base of the light-emitting element layer 5.

An anode electrode 22 is formed by layering Indium Tin Oxide (ITO) and an alloy containing Ag. The anode electrode 22 has a light reflectivity.

The light-emitting element layer 5 (for example, an organic light-emitting diode layer) includes a first electrode 22 (for example, an anode electrode) which is disposed in a layer above the flattening film 21, a bank 23c which covers the edges of the first electrode 22, an Electro Luminescence (EL) layer 24 which is disposed in a layer above the first electrode 22, and a second electrode 25 which is disposed in a layer above the EL layer 24. A light-emitting element (for example, an organic light-emitting diode) is formed of the first electrode 22, the EL layer 24, and the second electrode 25.

In an inactive region NA, A convex TK is disposed. The convex TK is a frame-shaped surrounding an active region DA. The convex TK defines edges of the organic encapsulation film 27 (for example, an organic encapsulation film formed by an inkjet method). As illustrated in FIGS. 3A and 3B, the convex TK has an upper portion formed of the flattening film 21, and a lower portion formed of an organic insulating film 23k.

The bank 23c and the organic insulating film 23k may be formed by the same process. For example, the active region DA and the non-active area NA is inkjet-coated with a photosensitive organic material such as polyimide or acryl which may be coated.

The EL layer 24 is formed at a region (a subpixel region) surrounded by the bank 23c by a vapor deposition method or an inkjet method. In case that the light-emitting element layer 5 is an Organic Light-Emitting Diode (OLED) layer, the EL layer 24 is formed by layering a hole-injecting layer, a hole transport layer, a light-emitting layer, an electron transport layer, and an electron-injecting layer, in this order from the bottom side. At least one layer of the EL layer 24 may be a common layer (shared by a plurality of pixels).

The first electrode (an anode electrode) 22 is formed by layering, for example, Indium Tin Oxide (ITO) and an alloy containing Ag, and has light reflectivity. The second electrode (for example, a cathode electrode) 25 is a common electrode, and may be formed of a transparent metal such as Indium Tin Oxide (ITO) or Indium Zinc Oxide (IZO).

In case that the light-emitting element layer 5 is an OLED layer, a drive current between the anode electrode 22 and the cathode electrode 25 recombines the holes and electrons in the EL layer 24, and the resulting excitons return to the ground state, thus light is emitted.

The light-emitting element layer 5 is not limited to the aforementioned OLED layer, and may be an inorganic light-emitting diode layer or a quantum dot light-emitting diode layer.

The encapsulation layer 6 includes a first inorganic encapsulation film 26 which covers the bank 23c and the cathode electrode 25, an organic encapsulation film 27 which is disposed in a layer above the first inorganic encapsulation film 26, and a second inorganic encapsulation film 28 which covers the organic encapsulation film 27.

Each of the first inorganic encapsulation film 26 and the second inorganic encapsulation film 28 may be a silicon oxide film, a silicon nitride film, a silicon oxynitride film, or a layered film composed of them. These films are provided by CVD using a mask. The organic encapsulation film 27 is a transmissive organic encapsulation film thicker than the first inorganic encapsulation film 26 and the second inorganic encapsulation film 28, and may be formed of a photosensitive organic material such as polyimide or acryl which may be coated. For example, after inkjet-coated with an ink which contains such an organic material, the first inorganic encapsulation film 26 is cured by an exposure to UV radiation. The encapsulation layer 6 (in particular, the first inorganic encapsulation film 26 and the second inorganic encapsulation film 28) cover the light-emitting element layer 5 and thus prevent impurities such as water and oxygen from penetrating into the light-emitting element layer 5.

The top film 9 is applied to the encapsulation layer 6 via the adhesive layer 8, and configured to function as a supporting material when the support 50 is removed. Materials for the top film 9 include, for example, polyethylene terephthalate (PET).

The bottom film 10 is a component to provide a flexible display device by applying the bottom film 10 to the lower surface of the resin layer 12 after removing the support 50. Materials for the bottom film 10 include, for example, PET. The functional film 39 has, for example, an optical compensation function, a touch sensor function, and a protection function.

As illustrated in FIGS. 3A and 3B, the display device 2 includes a first terminal portion T1 disposed on a surface of an end portion E1 located on a first edge, and a second terminal portion T2 disposed on a back face of an end portion E2 located on a second edge.

As illustrated in FIG. 3A, a terminal TMx at the first terminal portion T1 is connected to a terminal wiring TW, and the terminal wiring is connected to a lead-out wiring DW led from the active region, via a relay wiring. The end faces of the terminal TMx, terminal wiring TW, and lead-out wiring are covered by the flattening film 21.

As illustrated in FIG. 3B, the end portion E2 on the second edge of the display device 2 has a contact hole DH which extends through the gate insulating film 16, the passivation films 18, 20 and the barrier layer 3. The contact hole DH connects the terminal TMy (i.e., terminal on the back face) at the second terminal portion T2 and the terminal wiring TW.

On the back face of the terminal portion E2, an opening 12k aligned with the terminal TMy is disposed in the resin layer, and the bottom film 10 is removed to expose the terminal TMy on the back face. The opening 12k in the resin layer may be formed by increasing irradiation strength at the opening portion in Step S7 in FIG. 1 of irradiating the bottom surface of the resin layer 12 with laser light. This formation may be performed in a different process.

The terminal wiring TW is connected to a lead-out wiring DW led from the active region, via a relay wiring LW. The end faces of the terminal wiring TW and the lead-out wiring DW are covered by the flattening film 21. Furthermore, the contact hole DH is filled with the flattening film 21.

An electronic circuit board (for example, an IC chip, or an electronic circuit board such as a flexible printed circuit) is mounted to the first terminal portion T1 and the second terminal portion T2.

First Embodiment

Figure 4:
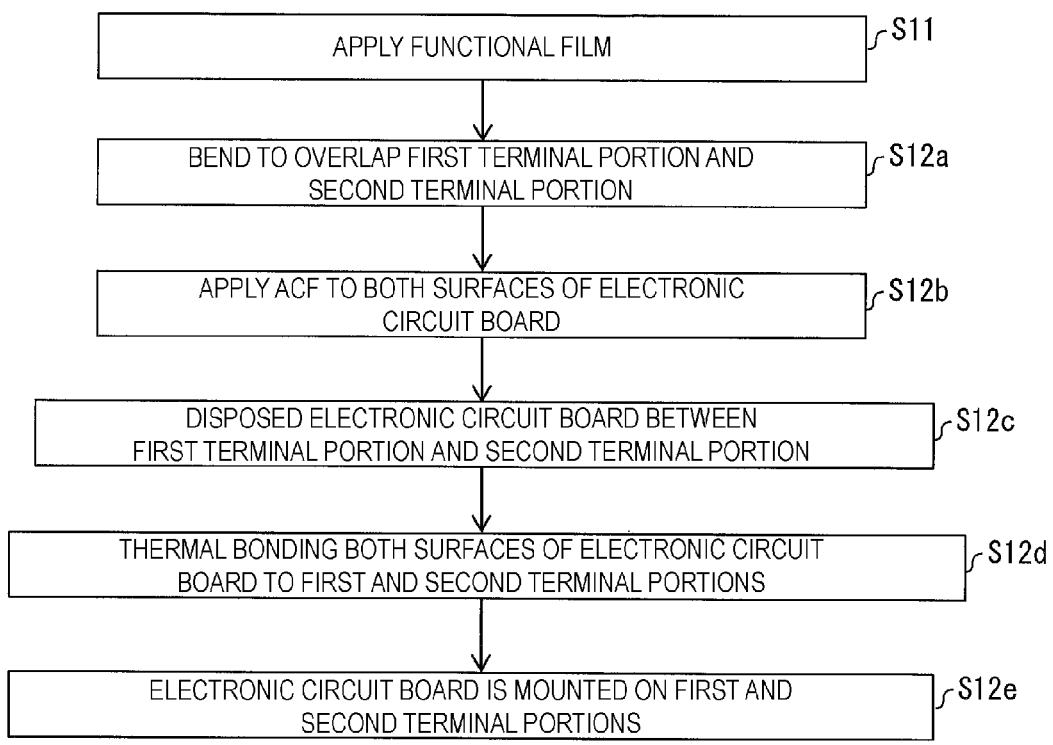
FIG. 4 is a flow chart illustrating a mounting process in the first embodiment.

FIG. 4 is a flow chart illustrating a mounting process for a first embodiment. FIG. 5A is a perspective view, FIG. 5B is a cross-sectional view, and FIG. 5C is another cross-sectional view, illustrating a configuration example of a display device according to the first embodiment.

First, subsequent to Step S11 in FIG. 1, the flexible display device 2, including a first edge H1 and a second edge H2 which extend in the same direction, is bent such that the first terminal portion T1 disposed on the front surface of the end portion located on the first edge H1 overlaps the second terminal portion T2 disposed on the back face of the end portion located on the second edge (Step S12a).

Next, Anisotropic Conductive Films (ACFs) 50x and 50y are applied to a first face 45f and a second face 45s of the electronic circuit board 45, respectively (Step S12b). The electronic circuit board 45 has a structure in which a first face 45f including a connection 45x and a second face 45s (opposite the first face) including a connection 45y are opposed to each other via an insulating layer 45b.

Next, the electronic circuit board 45 is disposed between the first terminal portion T1 including the terminal TMx and the second terminal portion T2 including the terminal TMy (Step S12c).

Next, the first terminal portion T1 and the second terminal portion T2 are thermal bonded to the first face 45f and the second face 45s of the electronic circuit board 45, respectively (Step S12d).

Thus, the electronic circuit board 45 is mounted to the first terminal portion T1 and the second terminal portion T2 (Step S12e). Specifically, the connection 45x of the electronic circuit board 45 is electrically connected to the terminal TMx of the first terminal portion T1, and the connection 45y of the electronic circuit board 45 is electrically connected to the terminal TMy of the second terminal portion T2.

The electronic circuit board 45 includes a driver chip 60 and a power source circuit unit 62 to supply power thereto. The connections 45x and 45y are connected to the driver chip 60.

According to the first embodiment, the first terminal portion T1 and the second terminal portion T2, which are non-display portions, are overlapped, thus a cylindrical display device with a thin seam in a display portion can be formed. Furthermore, it is possible to input various signals through the first terminal portion T1 and the second terminal portion T2. This is advantageous for driving. Furthermore, less wire routing region is required by providing both the first terminal portion T1 and the second terminal portion T2, thus a non-display region along a third edge H3 and a fourth edge H4 can be reduced.

Figure 6A:
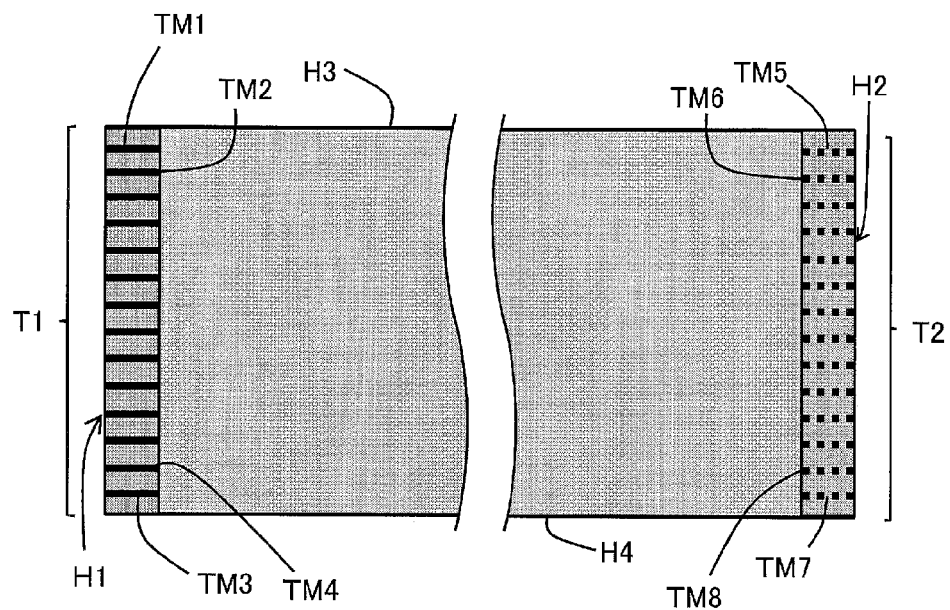
FIGS. 6A and 6B are plan views illustrating a terminal arrangement example for the first embodiment.
Figure 6B:
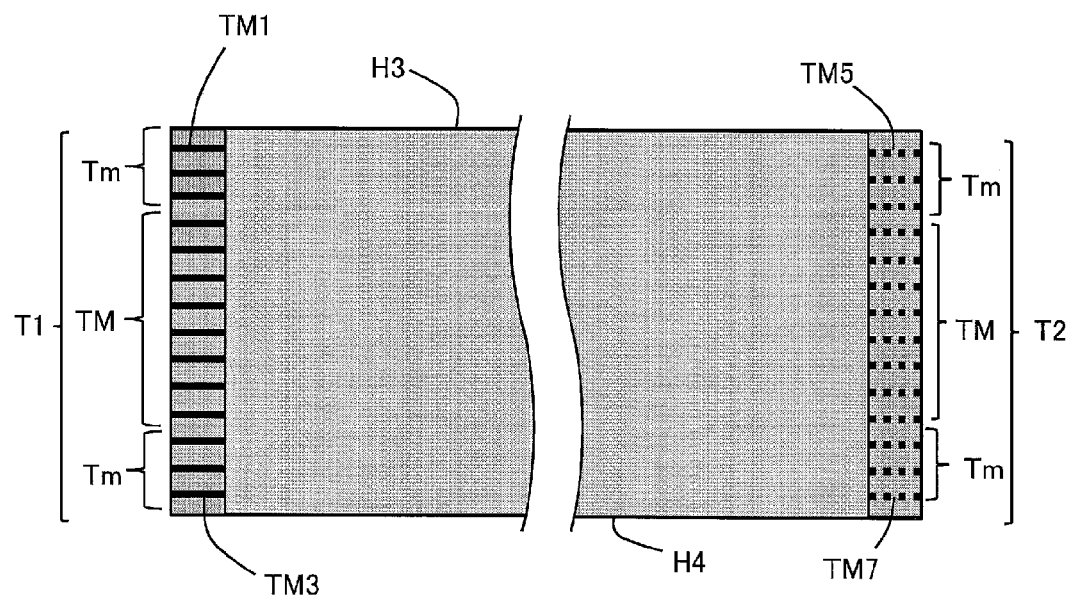

FIGS. 6A and 6B are plan views illustrating a terminal arrangement example of the first embodiment. As illustrated in FIG. 6A, the length of the first terminal portion T1 along a direction in which a plurality of terminals are arranged is substantially equal to the length of the first edge H1 (for example, the distance between the third edge H3 or the fourth edge H4 and the terminal nearest thereto is less than 5% of the length of the third edge H3 or the fourth edge H4). Furthermore, the length of the second terminal portion T2 along a direction in which a plurality of terminals are arranged is substantially equal to the length of the second edge H2 (for example, the distance between the third edge H3 or the fourth edge H4 and the terminal nearest thereto is less than 5% of the length of the third edge H3 or the fourth edge H4).

As illustrated in FIG. SA, the display device 2 includes the third edge H3 and the fourth edge H4 which are annularly bent. As illustrated in FIG. 6A, the distance between one endmost terminal TM1 in the first terminal portion T1 and the third edge H3 proximate thereto is less than or equal to the distance between the endmost terminal TM1 and its adjacent terminal TM2, while the distance between the other endmost terminal TM3 in the first terminal portion T1 and the fourth edge H4 proximate thereto is less than or equal to the distance between the endmost terminal TM3 and its adjacent terminal TM4.

Similarly, the distance between one endmost terminal TM5 in the second terminal portion T2 and the third edge H3 proximate thereto is less than or equal to the distance between the endmost terminal TM5 and its adjacent terminal TM6, while the distance between the other endmost terminal TM7 in the second terminal portion T2 and the fourth edge H4 proximate thereto is less than or equal to the distance between the endmost terminal TM7 and this adjacent terminal TM8.

Consequently, compared with the case in which the length of the first terminal portion T1 is made less than the first edge H1 and the length of the second terminal portion T2 is made less than the second edge H2, a uniform thermal bonding across the first terminal portion T1 can be obtained. Also, a uniform thermal bonding across the second terminal portion T2 can be obtained. This prevent defects such as raising at the ends of the terminal portions after thermal bonded to the electronic circuit board 45.

In the first terminal portion T1, as illustrated in FIG. 6B, one or more terminals sequentially arranged from the one endmost terminal TM1 and one or more terminals sequentially arranged from the other endmost terminal TM3 may be dummy terminals Tm (terminals not electrically connected to the signal lines of the electronic circuit board), and the other terminals may be true terminals TM (terminals electrically connected to the signal lines of the electronic circuit board). In the second terminal portion T2, as illustrated in FIG. 6B, one or more terminals sequentially arranged from the one endmost terminal TM5 and one or more terminals sequentially arranged from the other endmost terminal TM7 may be dummy terminals Tm, and the other terminals may be true terminals TM.

Figure 7:
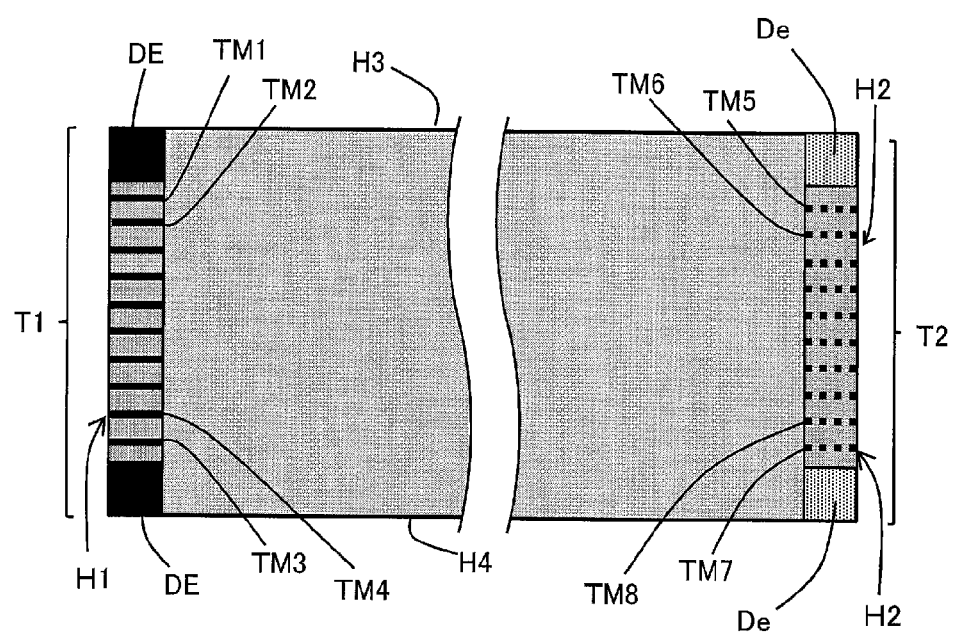
FIG. 7 is a plan view illustrating another terminal arrangement example for the first embodiment.

As illustrated in FIG. 7, the first terminal portion T1 may have a configuration as follows. The distance between one endmost terminal TM1 and the third edge H3 proximate thereto is greater than the distance between the endmost terminal TM1 and its adjacent terminal TM2, and dummy electrodes DE (terminals not electrically connected to the signal lines of the electronic circuit board) which are greater in length in the direction along the first edge H1 compared with the other terminals are provided between the endmost terminal TM1 and the third edge H3. Furthermore, the distance between the other endmost terminal TM3 and the fourth edge H4 proximate thereto is greater than the distance between the endmost terminal TM3 and its adjacent terminal TM4, and dummy electrodes DE are provided between the endmost terminal TM3 and the fourth edge H4. Similarly, the second terminal portion T2 may have a configuration as follows. The distance between one endmost terminal TM5 and the third edge H3 proximate thereto is greater than the distance between the endmost terminal TM5 and its adjacent terminal TM6, and dummy electrodes De (terminals not electrically connected to the signal lines of the electronic circuit board) which are greater in length in the direction along the second edge H2 compared with the other terminals are provided between the endmost terminal TM5 and the third edge H3. Furthermore, the distance between the other endmost terminal TM7 and the fourth edge H4 proximate thereto is greater than the distance between the endmost terminal TM7 and its adjacent terminal TM8, and dummy electrodes De are provided between the endmost terminal TM7 and the fourth edge H4.

This prevent defects such as raising at the ends of the terminal portions after thermal bonded to the electronic circuit board 45. This prevent defects such as raising at the ends of the terminal portions after thermal bonded to the electronic circuit board 45.

Figure 8:
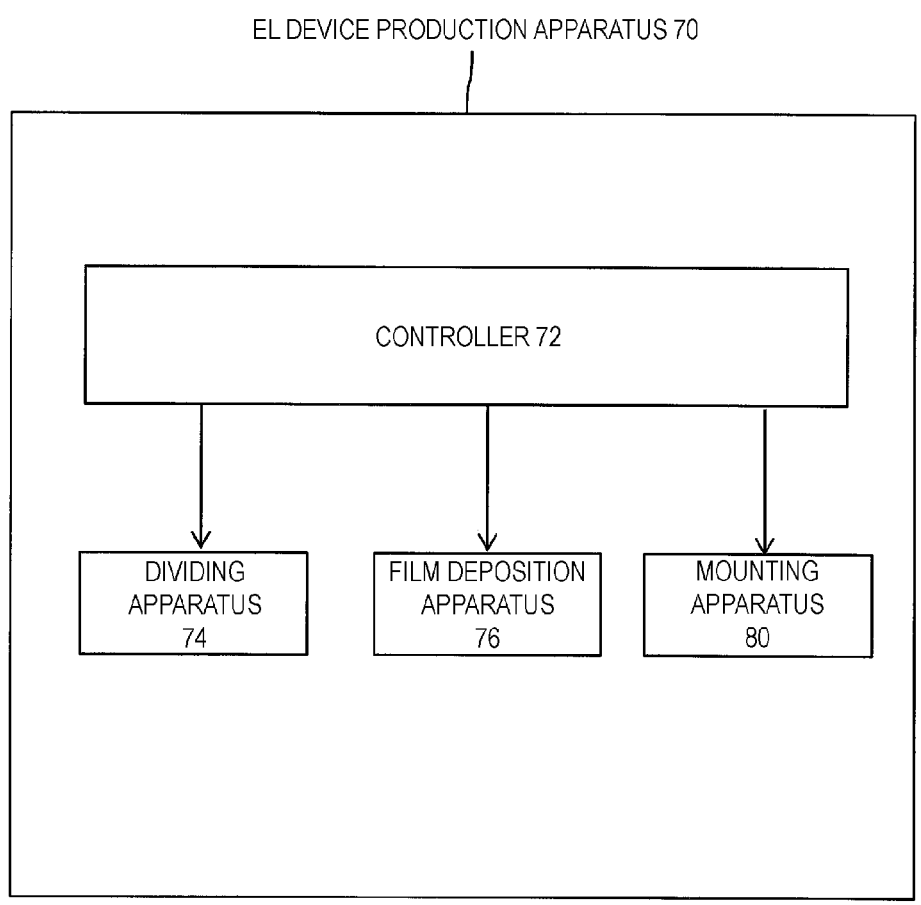
FIG. 8 is a block diagram illustrating a configuration of a manufacturing apparatus of a display device according to the embodiments.

As illustrated in FIG. 8, a manufacturing apparatus of a display device 70 includes a film deposition apparatus 76, a dividing apparatus 74, a mounting apparatus 80 including, for example, a thermal bonding tool, and a controller 72 configured to control these apparatuses. The mounting apparatus 80 controlled by the controller 72 performs steps 512a to 512d in FIG. 4.

Figure 9A:
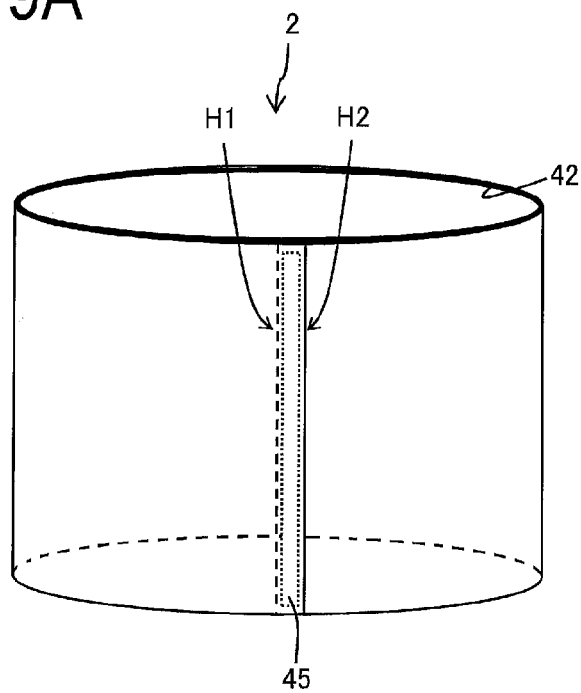
FIG. 9A is a perspective view and FIG. 9B is a cross-sectional view, illustrating a modification of the display device according to the first embodiment.
Figure 9B:
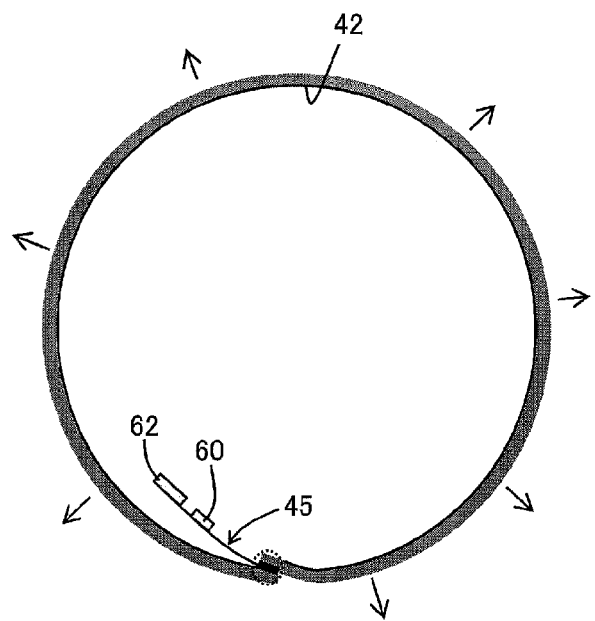

In the first embodiment, as illustrated in FIGS. 9A and 9B, a touch sensor layer 42 may be disposed at the inner face (for example, in a layer under the bottom film 10) of the display device 2 in FIGS. 5A to 5C.

Figure 10A:
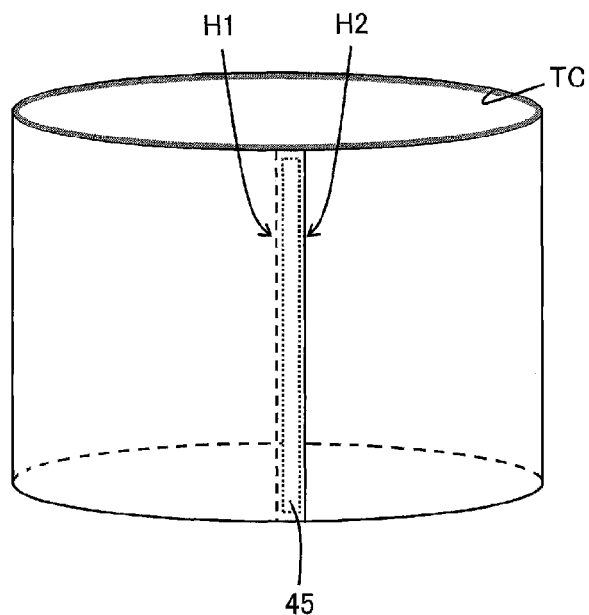
FIG. 10A is a perspective view and FIG. 10B is a cross-sectional view, illustrating another modification of the display device according to the first embodiment.
Figure 10B:
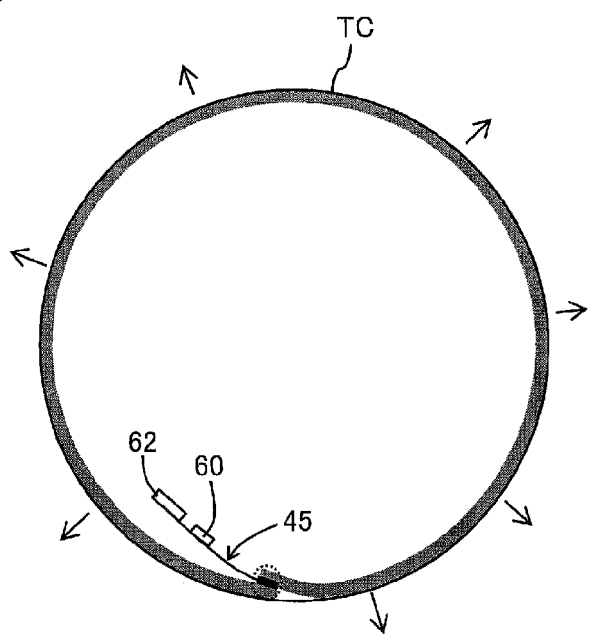

According to the first embodiment, the light-emitting face (i.e., the front surface of the display portion) of the display device 2 in FIGS. 5A to 5C may be applied to the inner face of the transmissive cylindrical covering TC as illustrated in FIGS. 10A and 10B. The cylindrical covering TC is not limited to being circular in cross section, and may be oblong, triangle, rectangle, rounded-corner triangle, rounded-corner rectangle, etc., in cross section.

Second Embodiment

Figure 11A:
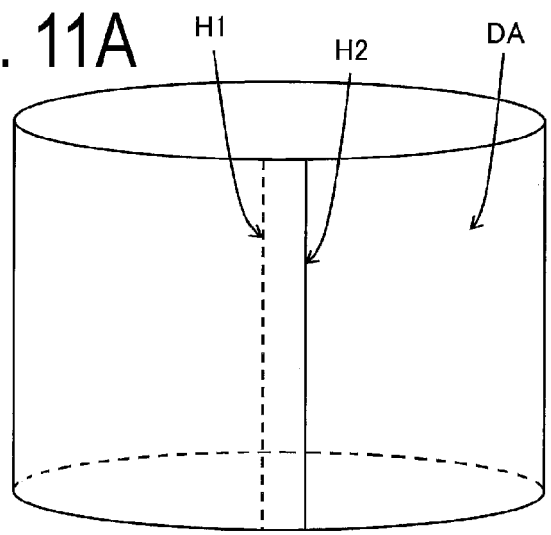
FIG. 11A is a perspective view.
Figure 11B:
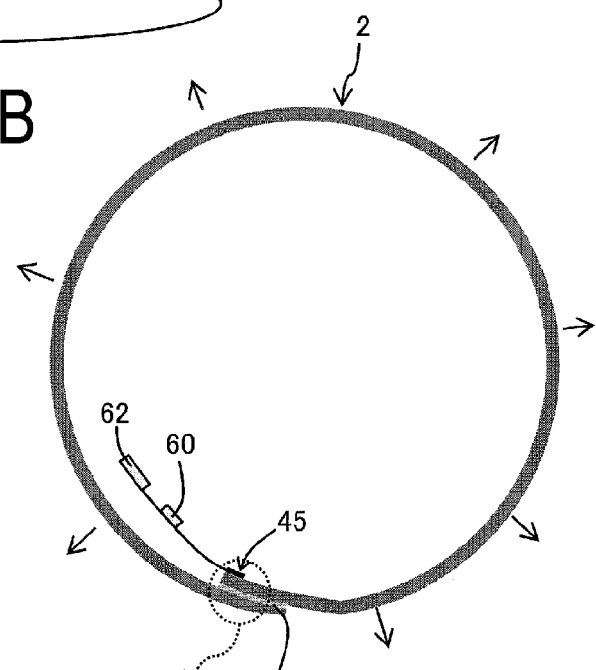
FIG. 11B is a cross-sectional view.
Figure 11C:
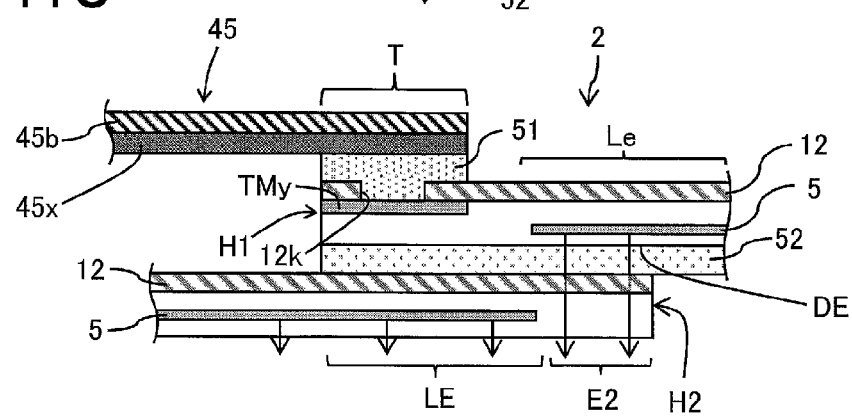
FIG. 11C is another cross-sectional view, illustrating a display device according to a second embodiment.

The first embodiment describes overlapping the first terminal portion T1 and the second terminal portion T2. However, the disclosure is not limited thereto. As illustrated in FIGS. 11A, 11B, and 11C, a configuration may be obtained in which light is emitted toward the front side with the display device in a bent state with a terminal portion T disposed on the back face of the end portion located on the first edge H1 and the end portion LE located on the second edge H2 of the light-emitting element layer 5 overlapping one another, and in which the electronic circuit board 45 is mounted on the terminal portion T via an ACF 51. In other words, the connection 45x of the electronic circuit board 45 is electrically connected to the terminal (terminal on a back face) TMy of the terminal portion T.

In FIGS. 11A, 11B, and 11C, the end portion 45 is located inward from the terminal portion LE on the second edge H2 of the light-emitting element layer 5, and the end portion LE on the second edge H2 of the light-emitting element layer 5 and the end portion Le on the first edge of the light-emitting element layer 5 are overlapped. Furthermore, the end portion E2 on the second edge of the display device 2 is adhered to the end portion DE on the first edge H1 of the display face by a transmissive adhesive 52. The end portion E2 of the second edges side is transmissive.

Consequently, it is possible to provide a cylindrical display device with little seam in a display portion.

Electrooptical elements of the display device according to the embodiment (electrooptical elements whose brightness ant transmittance are controlled by a current) are not particularly limited. Displays according to the embodiment includes, for example, an organic EL display which includes an Organic light-emitting Diode (OLED) as an electrooptical element, an inorganic EL display which includes an inorganic light-emitting diode as an electrooptical element, and a QLED display which includes a Quantum dot light-emitting Diode (QLED).

Supplement

According to a first aspect, a display device with a first edge and a second edge, the first edge and the second edge extending in a same direction, includes:

a light-emitting element layer; and an electronic circuit board, wherein the display device emits light toward a front side with the display device being bent as a first terminal portion disposed on a surface of an end portion on the first edge, and a second terminal portion disposed on a back face of an end portion on the second edge, the first terminal portion and the second terminal portion are facing one another, and the electronic circuit board includes a first surface and a second surface opposite the first surface, the first surface being mounted to the first terminal portion and the second surface being mounted to the second terminal portion.

According to a second aspect, a length of the first terminal portion in a direction of arranging a plurality of terminals is near or equal to a length of the first edge.

According to a third aspect, the display device includes a third edge bent annularly, and a distance between an endmost terminal in the first terminal portion and the third edge proximate to the endmost terminal is less than or equal to a distance between the endmost terminal and a terminal adjacent to the endmost terminal.

According to a fourth aspect, the display device includes a third edge bent annularly, and at least one terminal sequentially arranged from the endmost terminal is a dummy terminal.

According to a fifth aspect, the display device includes a third edge bent annularly, and a distance between an endmost terminal in the first terminal portion and the third edge proximate to the endmost terminal is greater than a distance between the endmost terminal and a terminal adjacent to the endmost terminal and a dummy electrode is disposed between the endmost terminal and the third edge.

According to a sixth aspect, the first surface of the electronic circuit board and the first terminal portion are connected via an anisotropic conductor, and the second surface of the electronic circuit board and the second terminal portion are connected via an anisotropic conductor.

According to a seventh aspect, a touch sensor layer is disposed on the back face.

According to an eighth aspect, the display device includes a TFT layer with the first terminal portion, a light-emitting element layer disposed in a layer above the TFT layer, a barrier layer disposed in a layer under the TFT layer, and a resin layer disposed in a layer under the barrier layer.

According to a ninth aspect, the TFT layer and the second terminal portion are electrically connected via a contact hole extending through the TFT layer and the barrier layer, and an opening is disposed in the resin layer such that the opening overlaps the second terminal portion and the second terminal is exposed in the back face of the end portion on the second edge.

According to a tenth aspect, a light-emitting face is applied to an inner face of a transmissive cylindrical covering.

According to an eleventh aspect, a display device with a first edge and a second edge, the first edge and the second edge extending in a same direction, includes:

a light-emitting element layer; and an electronic circuit board, wherein the display device emits light toward a front side with the display device being bent as a first terminal portion disposed on a surface of an end portion on the first edge and a second terminal portion disposed on a back face of an end portion on the second edge are overlapping, the first terminal portion and the second terminal portion are facing one another, and the electronic circuit board is mounted to the terminal portion.

According to a twelve aspect, the terminal portion is located inward from the end portion on the second edge of the light-emitting element layer.

According to a thirteenth aspect, the end portion on the second edge of the light-emitting element layer and the end portion on the first edge of the light-emitting element layer overlap.

According to a fourteenth aspect, the end portion on the second edge is adhered to an end portion on first edge of a display face by a transmissive adhesive.

According to a fifteenth aspect, a manufacturing method of a display device with a first edge and a second edge, the first edge and the second edge extending in a same direction, including a light-emitting layer, a first terminal portion disposed on a surface of an end portion on the first edge and a second terminal portion disposed on a back face of an end portion on the second edge, the method includes bending the display device such that the first terminal portion and the second terminal portion are facing one another.

According to a sixteenth aspect, a first surface of an electronic circuit board is mounted to the first terminal portion, and a second surface of the electronic circuit board is mounted to the second terminal portion.

According to a seventeenth aspect, the light-emitting face is applied to an inner face of a transmissive cylindrical covering.

According to an eighteenth aspect, a manufacturing apparatus of a display device with a first edge and a second edge, the first edge and the second edge extending in a same direction, including a light-emitting layer, and a first terminal portion disposed on a surface of an end portion on the first edge and a second terminal portion disposed on a back face of an end portion on the second edge, performs bending the display device such that the first terminal portion and the second terminal portion are face one another.

According to nineteenth aspect, a mounting apparatus for manufacturing a display device with a first edge and a second edge extending in a same direction, makes a first terminal portion disposed on a surface of an end portion on the first edge to face to a second terminal portion disposed on a back face of an end portion on the second edge, mounts a first surface of the electronic circuit board to the first terminal portion, and mounts a second surface opposite the first surface to the second terminal portion.

According to a twentieth aspect, a controller configured to control the mounting apparatus controls the mounting apparatus to:

make a first terminal portion disposed on a surface of an end portion on the first edge to face to a second terminal portion disposed on a back face of an end portion on the second edge, mount a first surface of the electronic circuit board to the first terminal portion, and mount a second surface opposite the first surface to the second terminal portion.

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the present invention. Moreover, novel technical features may be formed by combining the technical approaches stated in each of the embodiments.

REFERENCE SIGNS LIST

2 Display device
4 TFT layer
5 Light-emitting element layer

6 Encapsulation layer
10 Bottom film
12 Resin layer
16 Gate insulating film
18 20 Passivation film
21 Organic interlayer film
23c Bank
23k Organic insulating film
24 EL layer
26 First inorganic encapsulation film
27 Organic encapsulation film
28 Second inorganic encapsulation film
T1, T2 First terminal portion, Second terminal portion
H1, H2 first edge, second edge
50 Support
45 Electronic circuit board
70 Display device manufacturing apparatus
80 Mounting apparatus

The invention claimed is:

1. A flexible display device with a first edge and a second edge, the first edge and the second edge extending in a same direction, the flexible display device comprising:
a light-emitting element layer; and
an electronic circuit board, wherein
the flexible display device emits light toward a front side with the flexible display device being bent as a first terminal portion disposed on a surface of an end portion on the first edge, and a second terminal portion disposed on a back face of an end portion on the second edge,
the first terminal portion and the second terminal portion are facing one another, and
the electronic circuit board includes a first surface and a second surface opposite the first surface, the first surface being mounted to the first terminal portion and the second surface opposite the first surface being mounted to the second terminal portion.

2. The display device according to claim 1, wherein a length of the first terminal portion in a direction of arranging a plurality of terminals is near or equal to a length of the first edge.

3. The display device according to claim 2, further comprising a third edge bent annularly, wherein a distance between an endmost terminal in the first terminal portion and the third edge proximate to the endmost terminal is less than or equal to a distance between the endmost terminal and a terminal adjacent to the endmost terminal.

4. The display device according to claim 3, further comprising a third edge bent annularly, wherein at least one terminal sequentially arranged from the endmost terminal is a dummy terminal.

5. The display device according to claim 1, further comprising a third edge bent annularly, wherein
a distance between an endmost terminal in the first terminal portion and the third edge proximate to the endmost terminal is greater than a distance between the endmost terminal and a terminal adjacent to the endmost terminal, and
a dummy electrode is disposed between the endmost terminal and the third edge.

6. The display device according to claim 1, wherein
the first surface of the electronic circuit board and the first terminal portion are connected via an anisotropic conductor, and
the second surface of the electronic circuit board and the second terminal portion are connected via an anisotropic conductor.

7. The display device according to claim 1, wherein a touch sensor layer is disposed on the back face.

8. The display device according to claim 1, further comprising:
a TFT layer including the first terminal portion;
a light-emitting element layer disposed in a layer above the TFT layer;
a barrier layer disposed in a layer under the TFT layer; and
a resin layer disposed in a layer under the barrier layer.

9. The display device according to claim 8, wherein
the TFT layer and the second terminal portion are electrically connected via a contact hole extending through the TFT layer and the barrier layer, and
an opening is disposed in the resin layer such that the opening overlaps the second terminal portion and the second terminal is exposed in the back face of the end portion on the second edge.

10. The display device according to claim 1, wherein a light-emitting face is applied to an inner face of a transmissive cylindrical covering.

11. A display device with a first edge and a second edge, the first edge and the second edge extending in a same direction, the display device comprising:
a light-emitting element layer that emits light toward a front side of the display device; and
an electronic circuit board mounted on a terminal portion that is located on a back side of a first end portion of the first edge, wherein
the display device is bent such that a front side of the first end portion of the first edge and a back side of a second end portion of the second edge overlap one another and are adhered together, and
a first end of the light-emitting element layer adjacent to the first edge is aligned with a second end of the light-emitting element layer adjacent to the second edge such that the light is contiguously emitted from an entirety of the front side of the display device.

12. The display device according to claim 11, wherein the terminal portion is located inward from the second end portion of the second edge.

13. The display device according to claim 11, wherein the second end portion of the second edge is adhered to the first end portion of the first edge by a light-transmissive adhesive.

14. A manufacturing method of a flexible display device with a first edge and a second edge, the first edge and the second edge extending in a same direction, the flexible display device including a light-emitting layer, and a first terminal portion disposed on a surface of an end portion on the first edge and a second terminal portion disposed on a back face of an end portion on the second edge, the method comprising:
bending the display device such that the first terminal portion and the second terminal portion are facing one another, wherein
a first surface of an electronic circuit board is mounted to the first terminal portion, and
a second surface of the electronic circuit board is mounted to the second terminal portion.

15. The manufacturing method of a flexible display device according to claim 14, wherein a light-emitting face is applied to an inner face of a transmissive cylindrical covering.

16. A manufacturing apparatus of a display device according to claim 1, the display device including
a light-emitting layer, and a first terminal portion disposed on a surface of an end portion on the first edge and a second terminal portion disposed on a back face of an end portion on the second edge, wherein the manufacturing apparatus performs bending of the display device such that the first terminal portion and the second terminal portion face one another.

17. A mounting apparatus for manufacturing a display device according to claim 1, wherein the mounting apparatus:

makes a first terminal portion disposed on a surface of an end portion on the first edge to face to a second terminal portion disposed on a back face of an end portion on the second edge;

mounts a first surface of the electronic circuit board to the first terminal portion; and mounts a second surface opposite the first surface to the second terminal portion.

18. A controller configured to control the mounting apparatus according to claim 17, wherein the controller controls the mounting apparatus to:

make a first terminal portion disposed on a surface of an end portion on the first edge to face to a second terminal portion disposed on a back face of an end portion on the second edge;

mount a first surface of the electronic circuit board to the first terminal portion; and mount a second surface opposite the first surface to the second terminal portion.

* * * * *